(12) United States Patent
Tan et al.

(10) Patent No.: US 7,089,522 B2
(45) Date of Patent: Aug. 8, 2006

(54) DEVICE, DESIGN AND METHOD FOR A SLOT IN A CONDUCTIVE AREA

(75) Inventors: Patrick Tan, Singapore (SG); Kheng Chok Tee, Singapore (SG); David Vigar, Singapore (SG); Tat Wei Chua, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 517 days.

(21) Appl. No.: 10/458,992

(22) Filed: Jun. 11, 2003

(65) Prior Publication Data
US 2004/0255259 A1    Dec. 16, 2004

(51) Int. Cl.
G06F 17/50 (2006.01)

(52) U.S. Cl. .............. 716/11; 716/12; 716/10; 716/9

(58) Field of Classification Search ............. 716/11, 716/12, 10, 9
See application file for complete search history.

(56) References Cited

U.S. PATENT DOCUMENTS

| | | |
|---|---|---|
| 5,602,423 A | 2/1997 | Jain |
| 5,671,152 A | 9/1997 | Lavin et al. |
| 5,763,955 A * | 6/1998 | Findley et al. ............. 257/775 |
| 5,790,417 A * | 8/1998 | Chao et al. .................. 716/21 |
| 5,923,563 A | 7/1999 | Lavin et al. |
| 6,081,272 A | 6/2000 | Morimoto et al. |
| 6,094,812 A | 8/2000 | English et al. |
| 6,319,818 B1 | 11/2001 | Stamper |
| 6,396,158 B1 | 5/2002 | Travis et al. |
| 6,403,389 B1 | 6/2002 | Chang et al. |
| 6,495,907 B1 | 12/2002 | Jain et al. |
| 6,567,964 B1 * | 5/2003 | Shin et al. ..................... 716/8 |
| 6,904,581 B1 * | 6/2005 | Oh ............................. 716/10 |
| 2002/0199162 A1 | 12/2002 | Ramaswamy et al. |
| 2003/0226757 A1 * | 12/2003 | Smith et al. ................. 205/82 |

OTHER PUBLICATIONS

Andrew B. Kahng et al., "Filling and Slotting: Analysis and Algorithms", ISPD 98 Monterey CA USA, p. 95-102.

* cited by examiner

*Primary Examiner*—Vuthe Siek
*Assistant Examiner*—Tuyen To
(74) *Attorney, Agent, or Firm*—William J. Stoffel

(57) ABSTRACT

A design, device, system and process for placing slots in active regions (e.g., metal areas). Embodiments of the present invention improve the planarization of metal areas (e.g., lines) and insulators by reducing depressions (e.g., dishing) in the metal areas by including symmetric or square slots inside selected wide metal lines, by adhering to a set of placement rules. Embodiments reduce dishing in copper dual damascene structures. Embodiments reduce data processing requirements for designing and arranging the layout of IC devices and the slots.

41 Claims, 13 Drawing Sheets

EE = MINIMUM EDGE EXCLUSION = 1 MICRON

SS = SLOT SPACING = 4 MICRONS

| Slot size | spacing between odd and even layer (y) | slot spacing (2y+x) |
|---|---|---|
| 0.5 | 1 | 2.5 |
| 1 | 1 | 3 |
| 1.5 | 1 | 3.5 |
| 2 | 1 | 4 |
| 2.5 | 1 | 4.5 |
| 3 | 1 | 5 |
| 3.5 | 1 | 5.5 |
| 4 | 1 | 6 |
| 0.5 | 0.5 | 1.5 |
| 1 | 0.5 | 2 |
| 1.5 | 0.5 | 2.5 |
| 2 | 0.5 | 3 |
| 2.5 | 0.5 | 3.5 |
| 3 | 0.5 | 4 |
| 3.5 | 0.5 | 4.5 |
| 4 | 0.5 | 5 |
| 0.5 | 2 | 4.5 |
| 1 | 2 | 5 |
| 1.5 | 2 | 5.5 |
| 2 | 2 | 6 |
| 2.5 | 2 | 6.5 |
| 3 | 2 | 7 |
| 3.5 | 2 | 7.5 |
| 4 | 2 | 8 |

DEVICE, DESIGN AND METHOD FOR A SLOT IN A CONDUCTIVE AREA

BACKGROUND OF INVENTION

1) Field of the Invention

This invention relates in general to semiconductor devices, methods for designing semiconductor devices, masks and mask designs, and more particularly, to semiconductor designs, methods and devices with slots in active areas.

2) Description of the Prior Art

Semiconductor integrated circuits and printed circuit electronic packages are generally structures comprised of several layers of conducting, insulating and other materials that are structured in the horizontal dimension by fabrication processes that transfer patterns defined in physical designs or layouts. A layout consists of a set of planar geometric shapes in several layers. These physical designs or layouts are typically represented as computer data consisting of two dimensional shapes in a hierarchical data structure that exploit the repetitive structure usually found in such circuits and packages. The design or layout files are then converted into pattern generator files that are used to produce-patterns called masks.

In some cases, the action of the fabrication process is affected by the design patterns being transferred to the physical materials. For example, the local pattern density of the design, i.e., the fraction of area over which material is deposited (or removed) can affect the shapes and dimensions of features, with the "locality extent" dependent on the specific fabrication process. A special process that may be affected by local pattern density is chemical-mechanical (so called "chemech") polishing (CMP). CMP is used to planarize semiconductor substrates. Planarization is becoming more and more important as the numbers of layers used to form a semiconductor device increases. Nonplanar substrates show many problems including difficulties in patterning a photoresist layer, formation of a void within a film during film deposition, and incomplete removal of a layer during an etch process leaving residual portions of the layer.

However, CMP has the disadvantage of showing so called "dishing" when polishing areas of wide metal. Especially in case copper is used this effect will result in nonplanar surfaces of the substrate, leading to the difficulties mentioned above.

FIG. 1 shows two situations where dishing occurs. Within smaller wires (A) dishing can be neglected to a certain degree, whereas for wide wires (B) it shows big impact on the metal's resistance and on the manufacturability.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,602,423(Jain) that shows a metal line inlaid with slots or pillars.

U.S. Pat. No. 6,403,389b1(Chang et al.) shows a method for forming slots in conductors to prevent dishing during chemical-mechanical polish.

U.S. Pat. No. 6,495,907b1(Jain et al.) shows a conductor reticulation and process.

U.S. Pat. No. 5,671,152(Lavin et al.) shows a method for generating negative fill shapes for metal lines.

U.S. Pat. No. 6,319,818b1(Stamper) shows a method to add holes to metal lines to improve CMP planarization.

U.S. Pat. No. 6,094,812(English et al. ) shows a method to split up metal lines.

U.S. Pat. No. 5,923,563(Lavin et al.) shows a method to add fill shapes.

U.S. Pat. No. 2002/0199162A1(Ramaswamy et al.) Dec. 15, 2002 discloses a method for a fill pattern.

U.S. Pat. No. 6,396,158B1(Travis) shows a method for designing dummy feature in a mask layout.

U.S. Pat. No. 6,081,272(Morimoto et al.) shows a method of sizing and position dummy structures.

Andrew B. Kahng et al., "Filling and Slotting: Analysis and Algorithms", ISPD 98 Monterey Calif. USA, pp. 95–102.

However, these designs, methods and device can be improved upon.

SUMMARY OF THE INVENTION

It is an object of embodiments of present invention to provide a method for fabricating a device layout or design that has slots.

It is an object of embodiments of present invention to provide a structure and method for fabricating a mask that has slots.

It is an object of embodiments of present invention to provide a structure and method for fabricating a semiconductor device that has slots in conductive areas.

It is an object of embodiments of the present invention to provide a method to design masks for integrated circuits having slots.

It is therefore an object of embodiments of the present invention to provide an effective method to design semiconductor integrated circuits or electronic packages that solves the dishing problem associated with the CMP process.

It is another object of the invention to provide such a method for designing slots in conductive areas without increasing the data complexity significantly.

The embodiments of the present invention provides a method for determining the placement of slots representations in a layout of an integrated circuit design; the layout comprised of a plurality of conductive layer representations; the conductive layer representation comprised of conductive region representations; at least one the conductive region representation has a via contact representation between adjacent active layers;

the method comprising the steps of:

setting a reference for the placement of the slot representations with respect to the layout;

setting the minimum dimensions of the conductive region representations in which the slot representations are placed;

setting the dimensions of the slot representations;

setting the spacing between slot representations in conductive layer representations;

setting the clearance between the slot representations on adjacent conductive layer representations;

setting the stagger spacing between rows of adjacent slot representations in conductive layer representations;

setting the minimum distance from the edge of the slot representations to the edge of the conductive region representations;

setting the minimum distance between the contact via representation and the slot representation.

A preferred embodiment of the method comprises the steps of:

providing a layout comprised of a plurality of active layers;

the active layers comprised of active regions;

at least one the active regions has a via contact feature between adjacent active layers;

determining the placement of square slots in the layout by the following:

(reference) setting a reference for the placement of the square slots feature with respect to the layout;

(MS1) setting the minimum dimensions of the active regions in which the square slots features are inserted in to a minimum length of about 12 µm and a minimum width of about 12 µm;

(MS2) setting the dimensions of the square slot features are about 2 µm by about 2 µm;

(MS3) setting the minimum spacing between the square slots features on the same active region to about 4 µm;

(MS4) setting the minimum clearance between the square slots features on adjacent active layers to about 1 µm;

(MS5) setting the stagger spacing between rows of adjacent square slot features in the same active area to about 0 µm;

(MS 6) (edge exclusion) setting the minimum distance from the edge of the square slot features to the edge of the active region to about 1 µm;

(MS 7) setting the minimum distance between the contact via feature and the square slot feature to about 1 µm.

Another example embodiment is a semiconductor device comprising: a plurality metal layers over a substrate; the metal layers comprised of metal areas; via contacts between the metal layers; square slots in the metal areas; the square slots are substantially square;

the square slots positioned as follows:

the square slots placed with respect to a reference point;

the square slots positioned only in metal areas with dimensions greater than a minimum metal area dimensions;

a spacing between the square slots on a single metal area;

a stagger spacing between rows of adjacent square slots in the same metal layer;

a clearance between the square slots on adjacent metal layers;

a minimum distance from the edge of the square slots to the edge of the metal areas;

a minimum distance between the contact via and the square slots.

Additional preferred embodiments are set forth in the claims. This summary does not limit the interpretation of the claims.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 9A, 9B and 9C represent a view taken along axis 6B in FIG. 6A.

DETAILED DESCRIPTION OF THE PREFERRED EMBODIMENTS

I. Overview

In the following discussion, certain conventions and definitions will be used to simplify the description and facilitate understanding of the embodiments. For example, much of the description will describe the placement of symmetric shaped (e.g., square) slots in conductive areas, however, it is to be understood that in some embodiments of the invention, the placement occurs mathematically on computer models and layouts of IC devices rather than on a physical metal line.

Embodiments of the present invention are devices, designs and method of determining the placement of square slots in "wide" active regions (e.g., metal lines). Embodiments including square slots inside selected wide metal lines, by adhering to a set of guidelines/rules/steps. There guidelines are described below.

The method of designing slots in active regions reduces the complexity of slot placement, and improves design turnaround time. The slots can improve the planarization of metal areas (e.g., lines) and insulators by reducing depressions (e.g., dishing) in the metal areas.

Figure 2:
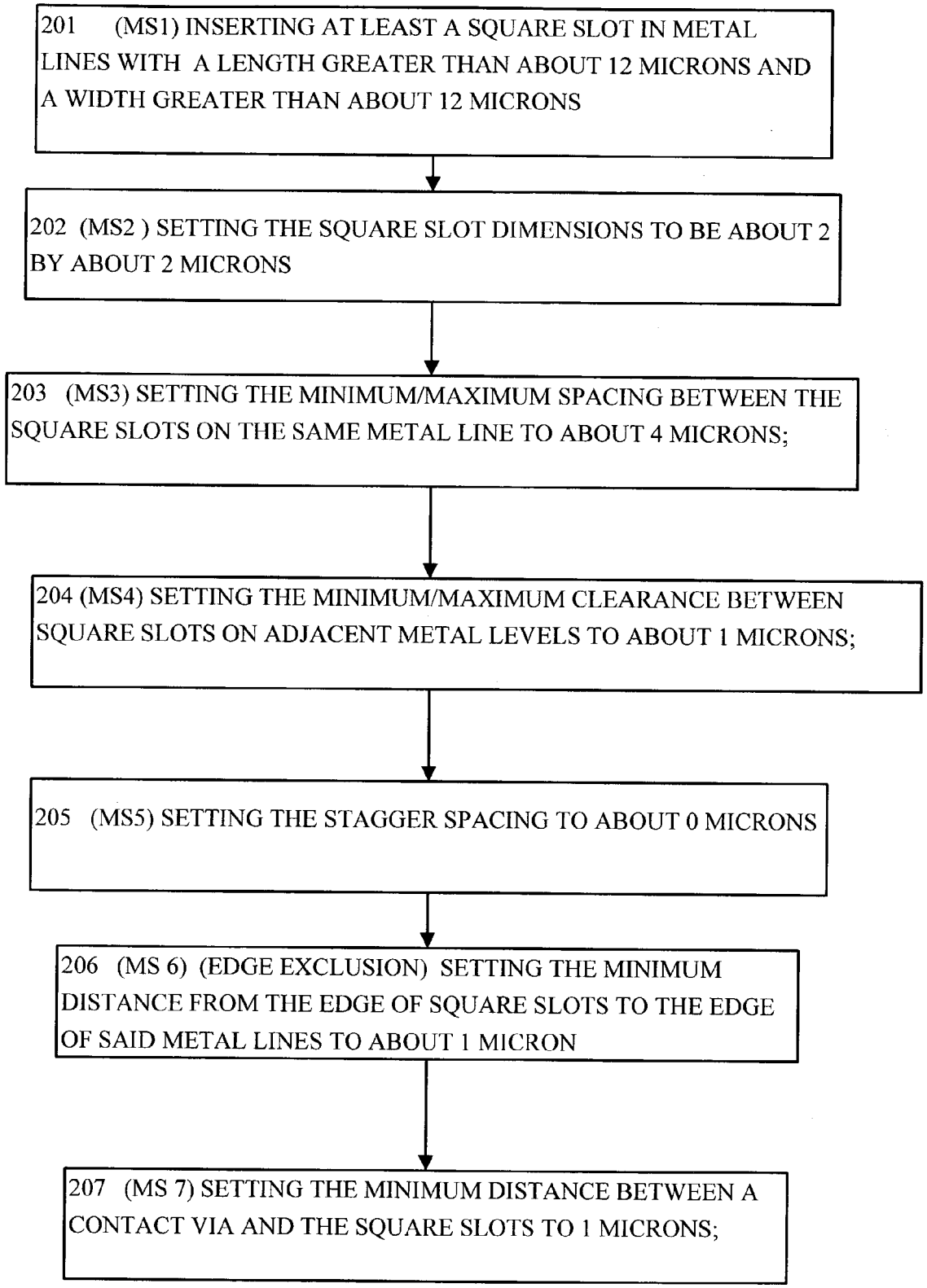
FIG. 2 is a flow chart for a method for a layout for positioning square slots in conductive area according to a preferred embodiment.

FIG. 2 shows a flow chart outlining preferred steps of an embodiment for placing square slots in metal areas.

II. Terminology layout—design of device, such as integrated circuit slot—space in a conductive area. The slot can be filled with dielectric material or conductive material or let a void.

slot region—material filling a slot.

slot feature—representation of a slot in a design of a device or mask design for the device square slot—a substantially square slot active layers—representation of conductive layers of a device. Can represent metal layers, such as M1, M2, etc to top metal layers in a device. Metal layers can be copper dual damascene layers.

active regions—representations of conductive regions of a device. For example, can represent metal lines, metal pads, capacitor plates, resistors, etc. interconnect layers or conductive layer or metal layers are conductors used in connecting circuit elements of an integrated circuit.

III. Slot Placement and Method for Design

An embodiment of the invention is an method that produces a layout design for an integrated circuit or one of more active layers (e.g., metal layers) for the integrated circuit with symmetric shaped slots in wide active layers. Preferred embodiments provide for square slots in wide dual damascene lines. The slots reduce the dishing in the active area (e.g., Cu lines) during chemical-mechanical polishing (CMP).

A. Layout is Comprised of a Plurality of Active Layers

A layout or representation of a IC design of one or more layers of an IC design is produced. The layout can be a computer data representation including active layer (e.g., metal layers or metal Levels (e.g., M1, M2). The active layers are representations that correspond to designed circuitry for a semiconductor device. The active layer can include portions of conductive lines (e.g., metal lines), capacitors, resistors, and power supplies.

The embodiments are especially applicable to 0.13 μm and 0.9 μm groundrule technology. (e.g., minimum line-width geometries of 0.13-micron or 90 Namometer)).

The embodiments can be used to place slots in dummy features or any "inactive metal areas" (e.g., dummy areas, test structures, etc). However it is possible to use the embodiments to place slots in resistors, capacitors, and inductors, although it may not be advantageous to do so.

The embodiments could also be used to place slots be used in metal area in packaging and printed circuit boards and other technologies with wide metal lines or areas.

Preferably the layout is in format of an electronic graphic database file of layout shapes, such as a GDSII data stream. The layout may be a standard layout database file exchange format such as GDS, GDSII, DXF, CIF, IGES, a flat file, or even a proprietary database file format. However, any data file format that defines the geometry of a layout could be used.

Figure 1:
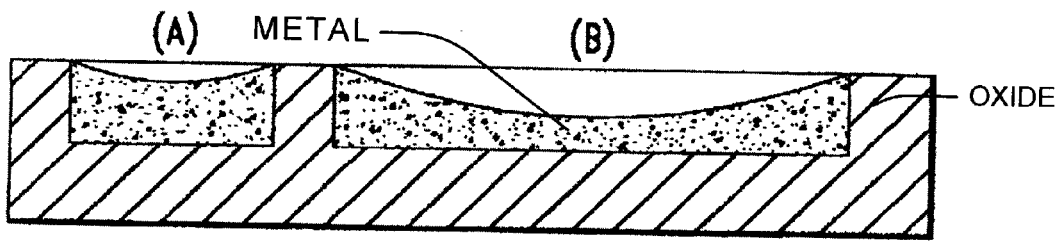
FIG. 1 shows a cross sectional view of the dishing problem according to the prior art.
Figures 3A, 3B:
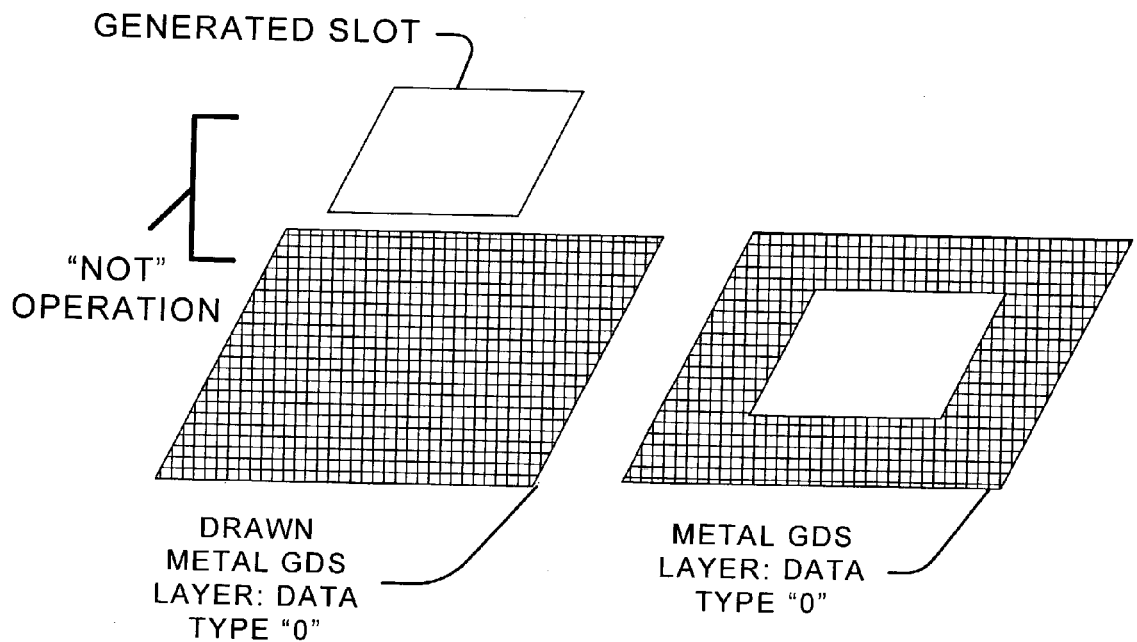
FIG. 3A shows a metal layer and a generated slot prior to a "not" operation.
FIG. 3B shows the metal pattern and slot after a "not operation". The metal layer is represented by a metal GDS layer; and the slots have the same GDS layer, but a different data type according to a preferred embodiment.

As shown in FIG. 3A, the input GDSII data will contain drawn active areas (e.g., metal lines or patterns representations) with or without drawn slots in any GDSII number and data type.

Embodiments (e.g., a program) will generate slots (e.g., squares or symmetric shapes) which will be used to "NOT" out slots in that metal layer. FIG. 3B shows an example of the line and slot after the "NOT" operation. This slotted metal will then be the final metal used as output GDSSII file. The metal layer and slot can have the same metal GDS layer: but different data types. For example, the metal layer can be Metal GDS layer: data type "0". The slot can be the same GDS layer; data type "8".

The shape of the slot is preferably symmetric (along one or two axis)

B. Active Layers are Comprised of Active Regions

The active layers can represent conductive layers or levels (e.g., M2) such as metal layers or levels. The active layers are comprised of active regions. Active regions can represent conductive lines (such as metal lines), pads, and devices such as capacitor plates, resistors. In a preferred embodiment, the active layer represents a metal layer.

C. A Via Contact Feature between Adjacent Active Layers

At least one the active regions has a via contact feature between adjacent active layers. The via contact feature represents via contacts between metal levels. The via contact features can represent interconnects, such as damascene or dual damascene interconnects. The via contact feature represents via contacts between metal levels. The via contact features can represent interconnect, such as dual damascene interconnects. The via contact features can represent to bottom via contact portion of dual damascene interconnect.

D. Flow Chart

The placement of square slots in the layout can be determined by applying the placement rules. A flowchart of an embodiment is shown in FIG. 2. A slot will not be place where all the rules can not be met.

E. Setting a Reference

Figure 4A:
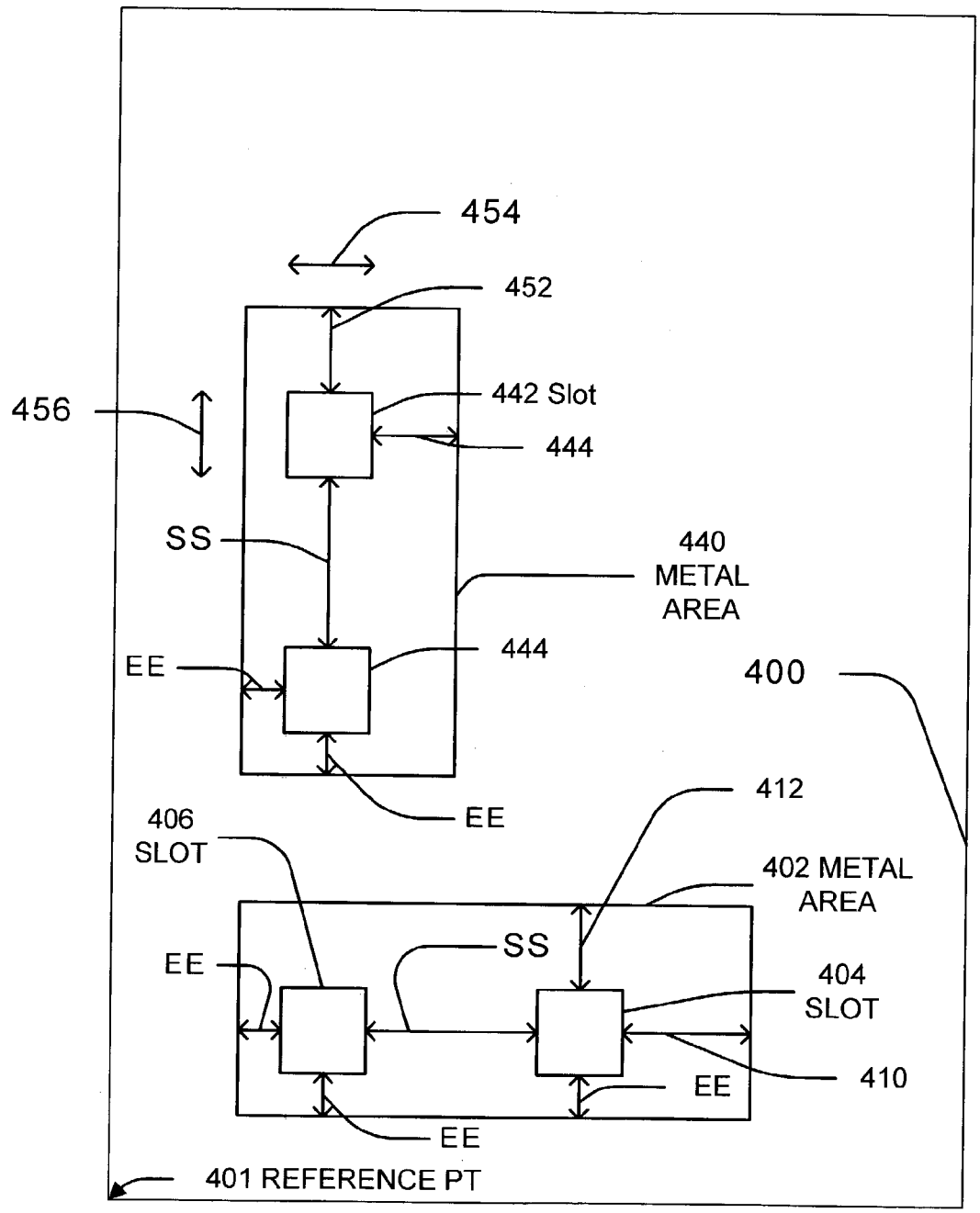
FIG. 4A shows a top down view of a layout or of a chip having slots in conductive areas according to embodiments of the invention.

A reference (point) is set for the placement of the square slots features with respect to the layout. For example, as shown in FIG. 4A, the reference point 401 is shown in the bottom left corner of the layout 400. FIG. 4A shows a top down view of a representation of a layer (e.g., level). FIG. 4A shows metal areas and slots in the metal areas.

The outline 400 can represent the outside edge of a chip. The metal areas and chip are not drawn to scale.

As shown in FIG. 4A, the square slots are orientated in relation to the reference point 401 which is, for example, in this case at the bottom left of the chip corner. For example, FIG. 4A shows the slots 404 406 orientated so that the minimum clearance distances (EE) are to the bottom and left sides of the active region (e.g., metal area) 402. Likewise, FIG. 4A shows the slots 442 444 orientated so that the minimum clearance distances (EE) are to the bottom and left sides of the metal area 440. For example, the slots have the minimum edge exclusion (EE) (of 1 μm) on the bottom and left sides of the metal areas. The minimum edge exclusion (EE) is the minimum distance from the slot to the edge of the metal area. (See further explanation below).

As shown in FIG. 4A, the slots are spaced 410 412 452 at least the minimum edge exclusion (EE) distance from the edges of the active areas 402 440 on the top and right sides of the active areas 402 440.

Figure 4B:
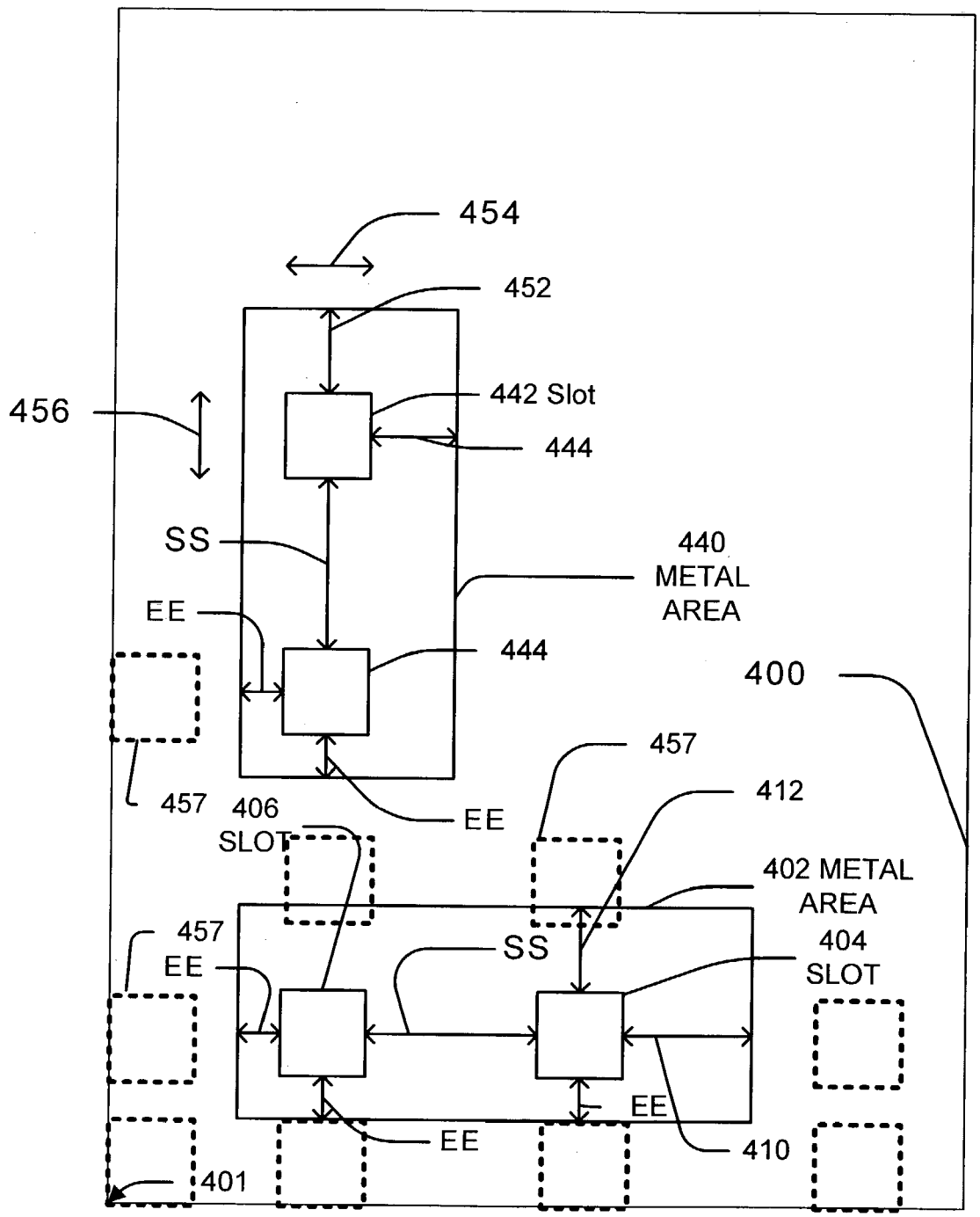
FIG. 4B shows a top down view of a layout or of a chip having slots in conductive areas and shows dashed slots 457 that are not included.

FIG. 4B is similar to FIG. 4A, but FIG. 4B shows the dotted line slots 457 that are examples of slots that are not drawn because they fall outside the metal, do not meet the rules and will not be placed F. (MS1) Slots Inserted in Wide Metal Lines The symmetrical or square slots are preferably included in active regions (e.g., metal lines) which are larger than minimum dimensions (See FIG. 2, step 201). Preferably the (square) slots are included in active regions larger than about 12 μm by 12 μm or 144 μm$^2$. That is the slots are placed in active regions with a length greater than about 12 μm and a width greater than about 12 μm. Note that most metal patterns are rectangular shaped because it is easier to design layouts. However, the invention is suitable were metal patterns that have other shapes. The determining the minimum active region dimensions in accordance with effects of dishing on the metal lines due to chemical mechanical polishing. The inventors have found that the choice of the 12 μm by 12 μm minimum dimension significantly reduces dishing problems by chemical-mechanical polishing (CMP) and reduces data processing load in slot design. The slots are preferably included in substantially all of the in active regions on a chip (or layout of a chip) (e.g., metal lines) which are larger than minimum dimensions For example, as shown in FIG. 4A, slots 404 406 are placed in active region (e.g., metal area) 402 which has a length and width greater than the minimum dimensions.

The slots are preferably shaped to minimize the effects on current flow and resistance in the conductive areas. In contrast, to rectangles that have a high resistance to current flow along the longer side. The most preferred slot shape is square.

In addition, in embodiments where square shaped slots are discussed, other shaped slots are feasible and the embodiments are not limited to square slots. For example, slots with symmetric shapes, especially in the direction of current flow are feasible. Acceptable shapes include, substantially square slots, circular slots, polygons such as hexagons, pentagons, etc. Preferred shapes are symmetrically around a point, have equal length sides (or arcs) (e.g., square, hexagon, octagon) and have an even number of sides.

Square shaped slots have advantages that they can be easily generated and arrayed and make the file size smaller. Square slots can be arrange so they are also independent of current direction. (as opposed to rectangular slots that block current more in the direction against the longer side). Square slots reduce the number of design rules. For example, slot density need not be checked because it is uniformly distribute din the wide metal area. However, the design rules are need to changed when converting from rectangular slots to square slots.

G. (MS2) Setting the Dimensions of the Slot Features

The slots are preferably substantially square. The dimensions of the square slot features are set at a length between 0.5 μm and 4 μm and most preferably about 2 μm and a width between 0.5 μm and 4 μm and most preferably about by about 2 μm.

Figures 4C, 4D:
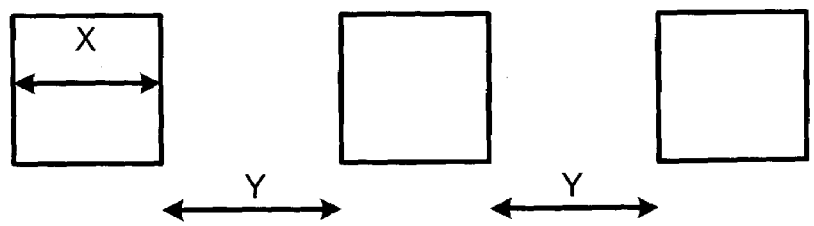
FIG. 4C shows a table of preferred slot sizes as a function of spacing between the odd and even layers (Y) and slot spacing *(2Y+X) according to a preferred embodiment of the invention.
FIG. 4D shows the spacing X and Y in relationship to the square slots as shown in FIG. 4C.

FIG. 4C shows a table of preferred slot sizes as a function of spacing between the odd and even layers (Y) and slot spacing *(2Y+X). FIG. 4D shows the spacing X and Y in relationship to the square slots.

The depth of the square slots is preferably the thickness of the active regions or metal area which surrounds the slot.

Referring to FIG. 4, the length and width 454 456 of square slot 442 is preferably about 2 μm.

The inventors chose this square slot dimension in combination with the other guidelines (physical and design) based on the electrical structures obtained.

The slots are preferably a shape that has a symmetry such that minimizes the affect current flow. For example, the slots preferably have square shapes, circular shapes, or symmetric polygons, etc. For example, rectangles with the length significantly longer than the width are preferred between of the effect on current flow.

H. (MS3) Setting the Minimum/Max Spacing between the Slots Features

Referring to FIG. 2, step 203, the (minimum/max) spacing between the square slots features on the same active region (e.g., metal area) is preferably between 1.5 μm to 8 μm and more preferably about 4 μm. See FIG. 4C for a table of preferred values.

Referring to FIG. 4A, the spacing (SS—Slot spacing) between the square slots features 404 406 on the same active region (e.g., metal area) 402 is about 4 μm.

I. (MS4) Setting the Clearance between the Square Slots Features on Adjacent Active Layers to about 1 μm;

Referring to FIG. 2, step 204, the (minimum/max) clearance between the square slots features on adjacent active layers is set to from about 0.5 μm to 2 μm and more preferably about 1 μm.

Figure 5A:
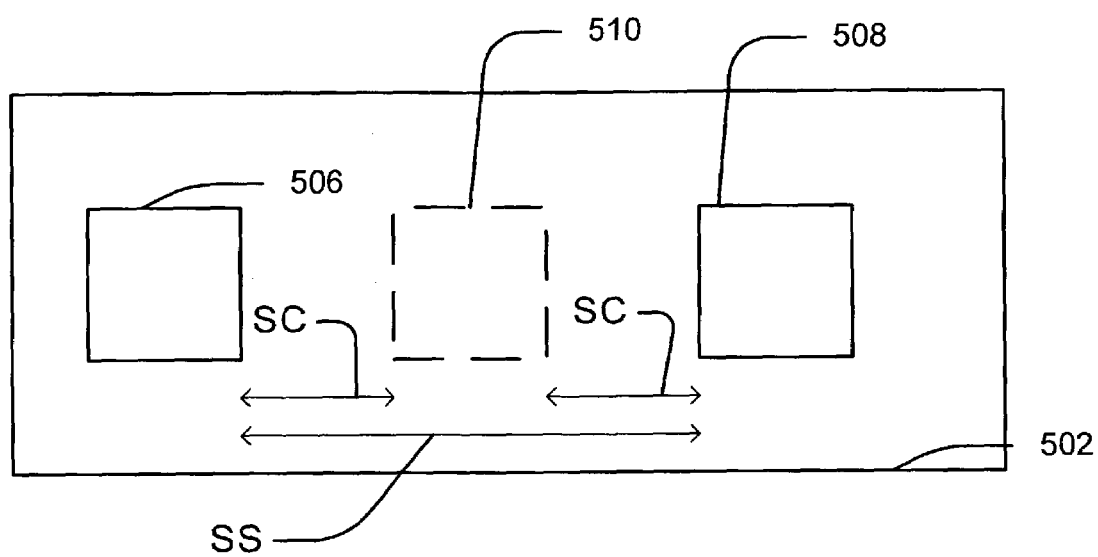
FIG. 5A shows a top plan view of a two layers of a layout or actual conductive areas and slots according to a example embodiment.

FIG. 5A shows a top down view of at least two active layers (e.g., metal lines) 502 that can represent odd or even (metal) adjacent layers over a substrate. For example, M1 is adjacent to M2 layer. The odd layer(s) have square slot features 506 508 that are spaced apart by the slot spacing SS of about 4 μm. The even active layers have slot 510. There can be one or more odd or even layers.

The slots 506 508 on an even layer are spaced from the Slots 510 in the odd layers by the clearance SC (slot clearance) of about from about 0.5 μm to 2 μm to more preferably about 1 μm. See FIG. 4C for a table of preferred values (e.g., Y).

Figure 5B:
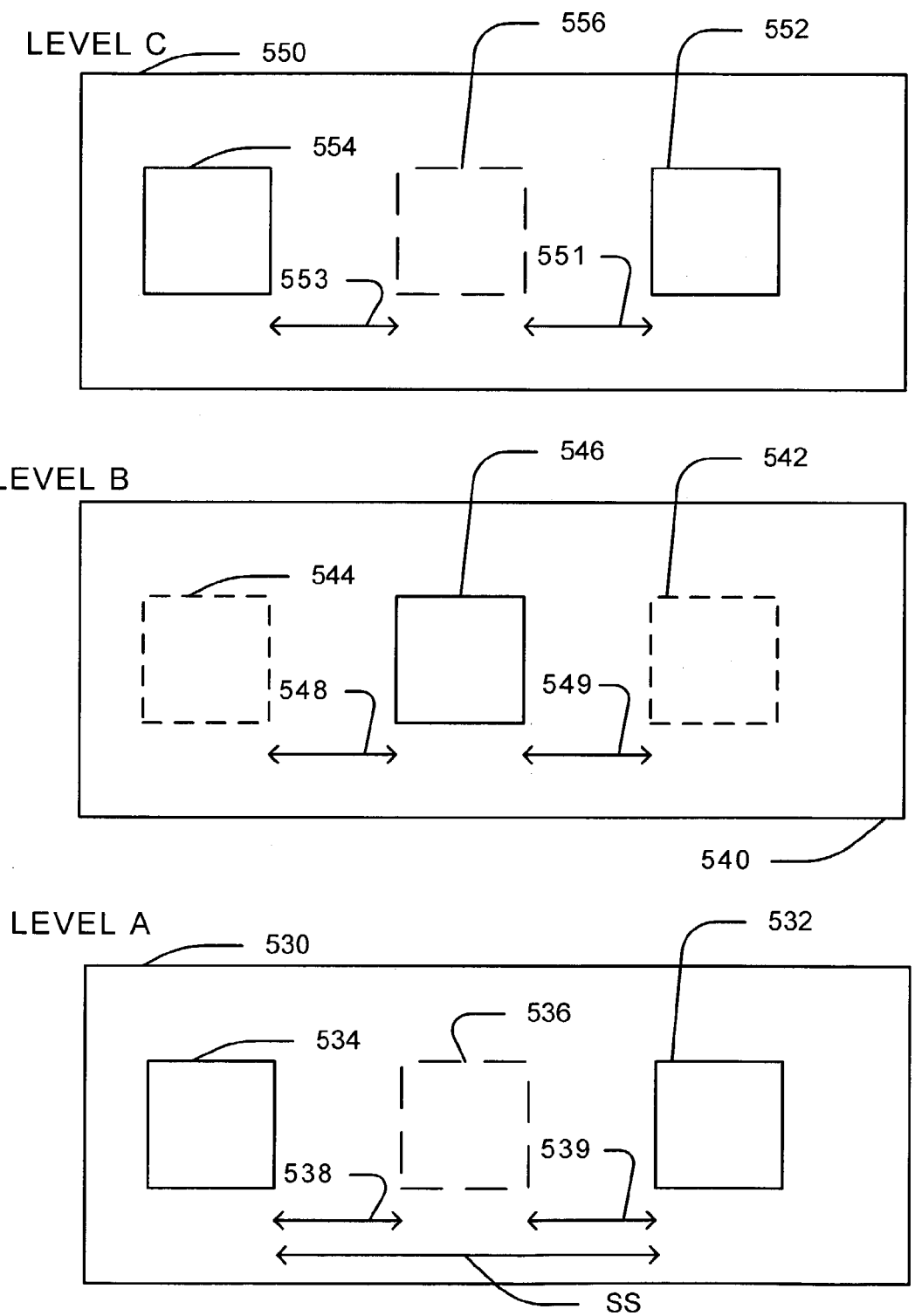
FIG. 5B shows a top plan view of a three layers of a layout or actual conductive areas and slots according to a example embodiment.

FIG. 5B further illustrate this clearance rule between slots on adjacent layers. FIG. 5B shows metal areas (or representations of metal areas) in three metal layers 530 540 550, such as the first three metal layers (e.g., M1,M2 and M3; or ML, ML+1, ML+2) above the substrate.

Active region 530 has slots 532 534. The slots 532 534 have a slot clearance (SC) 538 539 of about 1 μm from the slot 546 (536 is the projection of slot 546 on area 530) on the adjacent or neighboring (e.g., metal) active layer. For example the slot clearances 538 and 539 are at least 1 μm.

Active region 540 has slot 546. The slots 532 534 have a slot clearance (SC) 548 549 of about 1 μm from the slot 534 532 (544 542 is the projection of slots 534 532 and 554 552 on area 530) on the adjacent or neighboring layer. For example the slot clearances 548 and 549 are at least 1 μm.

Active region 550 has slots 552 554. The slots 552 554 have a slot clearance 553 551 of at about 1 μm from the slot 546 (556 is the projection of slot 546 on area 550) on the adjacent or neighboring layer. For example the slot clearances 551 553 are at about 1 μm.

J. (MS5) Setting the Stagger Spacing between Rows of Adjacent Square Slot Features The stagger spacing between rows of adjacent square slot features in the same active area is between 0 and 4 μm and most preferably about 0 μm. See FIG. 2, step 205.

Figure 7A:
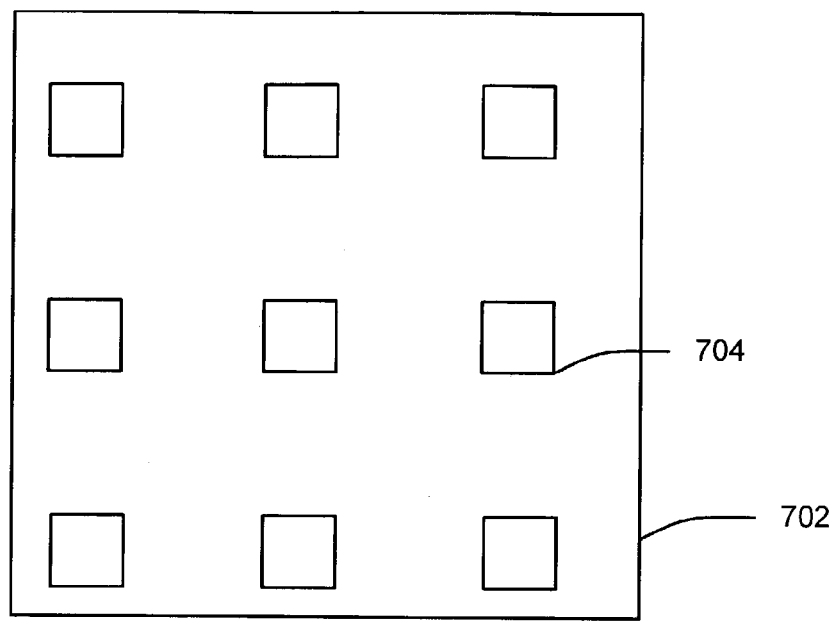
FIG. 7A is a top plan view of a layout that shows an unstaggered arrangement of slots according to a example embodiment.
Figure 7B:
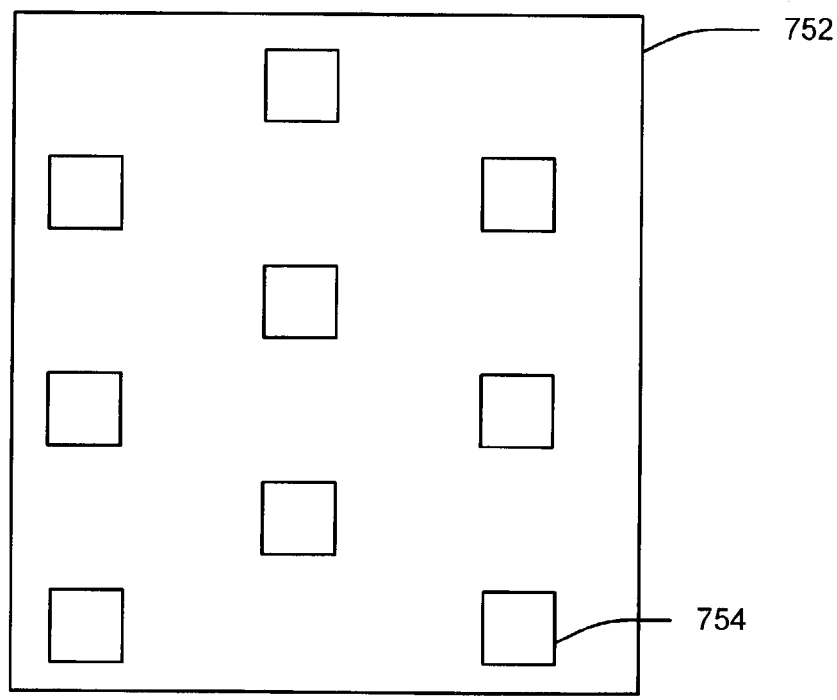
FIG. 7B is a top plan view of a layout that shows a staggered arrangement of slots.

As shown in FIG. 7A, for example, the rows and columns of square slots 704 are not staggered (e.g., stagger spacing=0) in the active area (e.g., metal area) 702. The setting of the stagger spacing to about 0 μm results in a simplification of the method and program.

In contrast to the embodiment in FIG. 7A, referring the 7B, the rows of slots 754 are staggered in the active area 752.

K. (MS 6) (Edge Exclusion) Setting the Minimum Distance from the Edge of the Square Slot Features to the Edge of the Active Regions The minimum distance from the edge of the square slot features to the edge of the active region is about 0.5 to 1.5 μm and more preferably about 1 μm. Also See FIG. 2, step 206.

For example, referring back to FIG. 4, the slots 404 406 have the minimum edge exclusion (EE) (of 1 μm) on the bottom and left sides of the active region 402 (metal area). The minimum edge exclusion (EE) is the minimum distance from the slot to the edge of the metal area.

As shown in FIG. 4, the slots 404 406 442 444 are spaced 410 412 444 452 with at least the minimum edge exclusion distance from the edges of the active areas 402 440 on the top and right sides.

L. (MS 7) Setting the Minimum Distance between the Contact Via Feature and the Square Slot Feature The minimum distance between the contact via feature and the square slot feature is about 1 µm. Also, see FIG. 2, step 207.

Figure 6A:
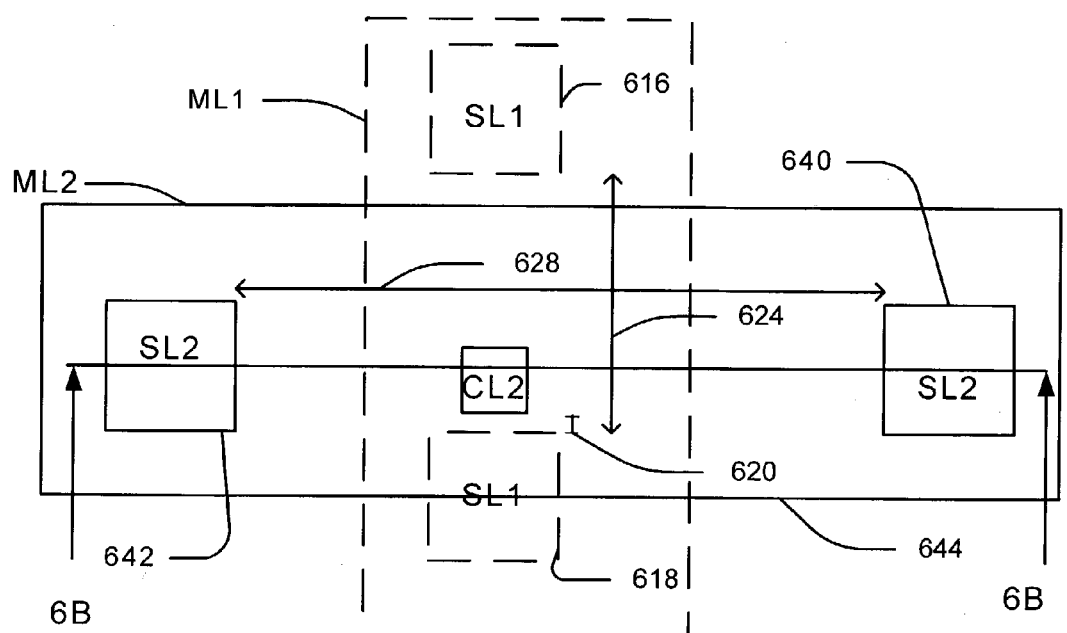
FIG. 6A shows a top plan view of a two layers of a layout or device according to a example embodiment.
Figure 6B:
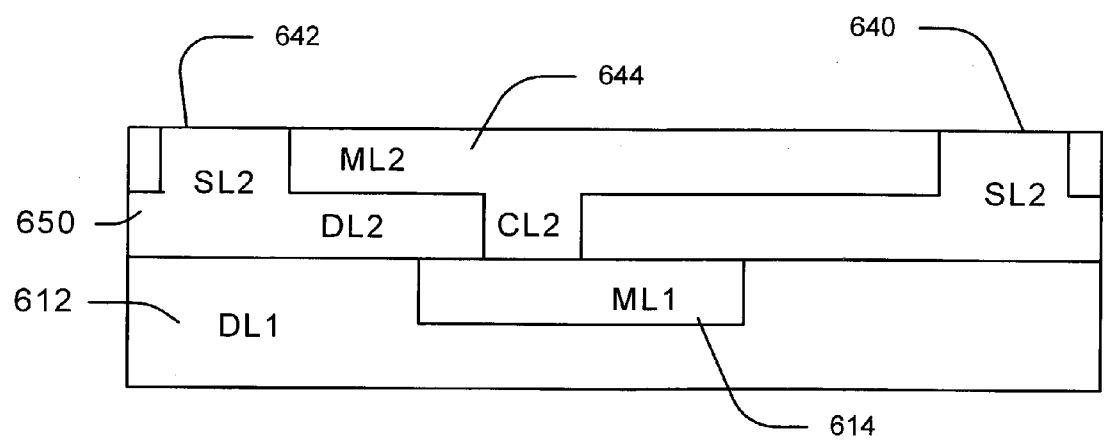
FIGS. 6B, 6C, 6D and 6E are cross sectional views take along axis 6B in FIG. 6A of a device according to a example embodiment.

For example, as shown in FIGS. 6A and 6B, a first metal area 1 is formed in a first dielectric layer 612. Square slots SL1 616 618 are placed in ML1 614 (e.g., metal layer or level 1, or active area 1).

A second metal area ML2 644 is formed over the metal area ML1 and in second dielectric layer 650. Square slots SL2 640 642 are placed in metal area ML2 644 (e.g., metal layer or level 2, or active region-2).

The minimum distance 620 between the contact via feature CL2 and the square slot feature SL1 618 is between about 0.5 and 2.0 and more preferably about 1 µm.

Referring to FIGS. 6A and 6B, the distance 628 between slots (SL2) 642 640 is about 8 µm because a slot could not be positioned under the via contact CL2. This would violate the (MS7) rule. See FIG. 2, step 207.

M. Example of the Square Slot Placement

Figure 8:
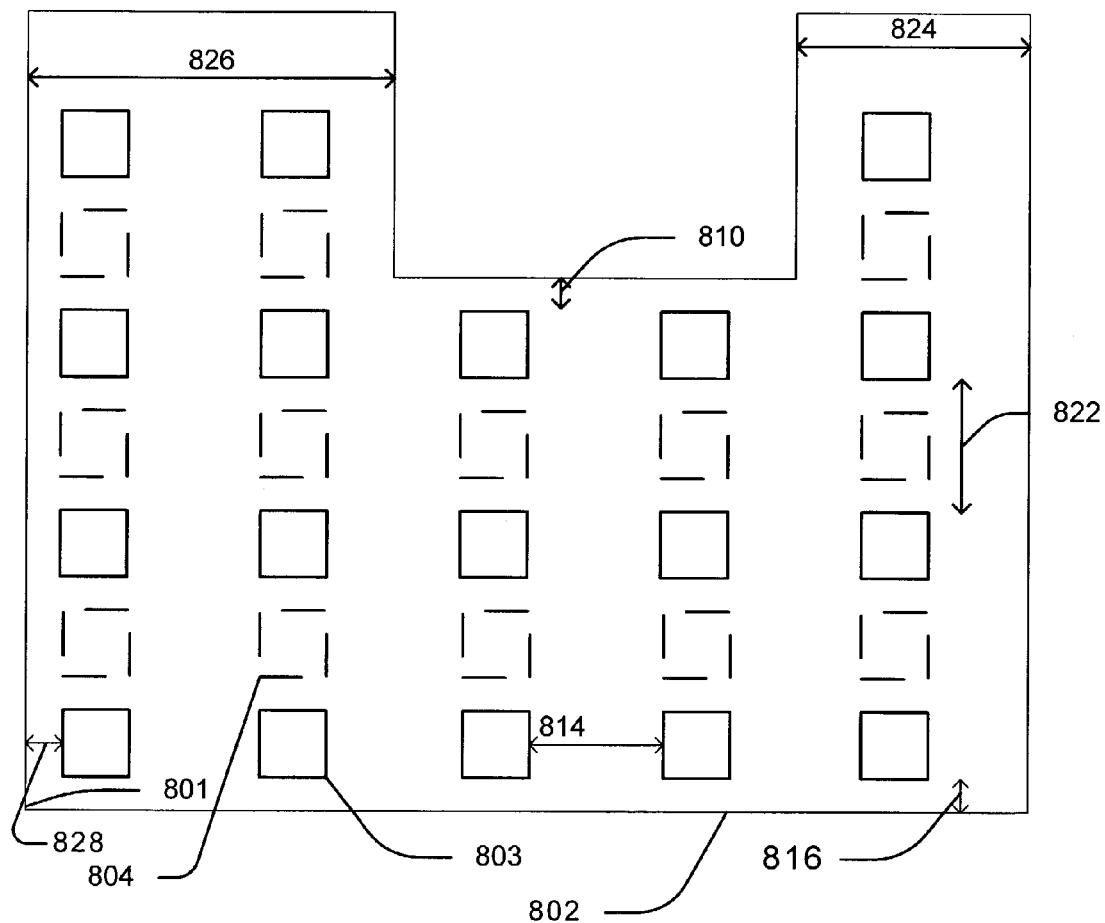
FIG. 8 is a top plan view of a 2 layers of a layout or metal area showing the arrangement of slot according to a example embodiment.

FIG. 8 shows another example of the square slot placement of the embodiment.

FIG. 8 is a top down representation of active region (e.g., metal area) 802 having slots 804. Slot elements 804 are projection of slots from an adjacent or neighboring layer either immediately above or below the layer of the active region 802.

In this example, the slots 803 804 are arranged with respect to reference point 801. Reference point 801 is in the bottom left hand corner of the layout (e.g., layout of chip or IC). But, for reference point 801 could be in other locations. For example, the reference point 801 could be the bottom left corner of a chip die.

The slots 803 have at least a minimum edge clearance distance 816 828.

Other examples include, the distances 824 826 are about 12.1 µm. Distance 801 is at least 1 µm. Slot spacing distance 822 is about 4 µm. the slots 803 804 have are substantially square with lengths and widths of about 2 µm.

N. The Placement of Square Slots Features is Performed by an Algorithm

The placement of the square slots can be performed by a program or an algorithm on a computer.

O. Other Embodiments

In an embodiment, the placement of the square slots features comprises adding square slot representations to a GDS format file that is used to fabricate a mask used in fabricating the semiconductor integrated circuit. The GDS format can be used to create a mask writer specific mask file that is used by an e-beam tool to make a mask.

In an embodiment, least one of the active regions or metal area has a dual damascene shape (e.g., See FIG. 6B, 644)

In an embodiment, the active regions represent metal lines; pads, and via contacts.

In an embodiment, a semiconductor device can be formed using the method of placing slots.

In an embodiment, masks can formed using the method to add slots to a layout. For example, a GSD file can be modified to add slots. This modified GSD file can be used to design and fabricate at least a mask used to make the designed device.

IV. Device and Process for Forming a Slot in a Metal Line

Referring to FIGS. 6A and 6B, slots SL1 and SL2 are placed in metal areas (ML1 and ML2).

FIGS. 6B, 6C, 6D and 6E are taken along axis 6B in FIG. 6A. FIG. 6B shows a cross sectional view of Slots (SL2) 640 642 in second metal area (ML2) 644. The metal layers preferably arranged in a vertical overlying relationship. FIG. 6B shows via contact CL2 connecting metal level 2 (ML2) (644) to metal level 1 (ML1) (614). In preferred embodiments, metal areas (ML1 and ML2) 614 644 are comprised of copper alloys. In preferred embodiments, metal areas ML1 and ML2 are formed by dual damascene processes. For example, second metal (ML2) is the top trench portion of a dual damascene interconnect and via contact (CL2) is the lower trench contact portion of the dual damascene interconnect.

Figure 6C:
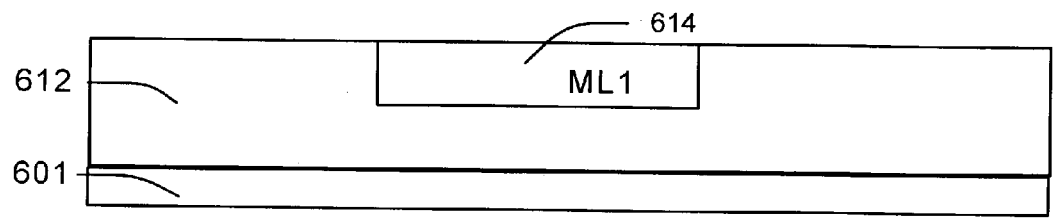

Referring to FIG. 6C, a metal area one (ML1) 614 is formed in a first dielectric layer 612 (DL1) over a semiconductor structure 601. The semiconductor structure can comprise a semiconductor substrate or a substrate with insulating and conductive layers there over. The first dielectric layer (DL1) 612 can represent any level dielectric layer over the structure 601.

A first metal area ML1 614 is formed over the first dielectric layer (DL1) 612. Preferably, the first metal area ML1 is formed using a damascene process. Preferably the first metal area is comprised of a copper alloy. The slots SL1 and SL2 640 642 in the first metal area help prevent dishing during the polish process of the damascene process.

Figure 6D:
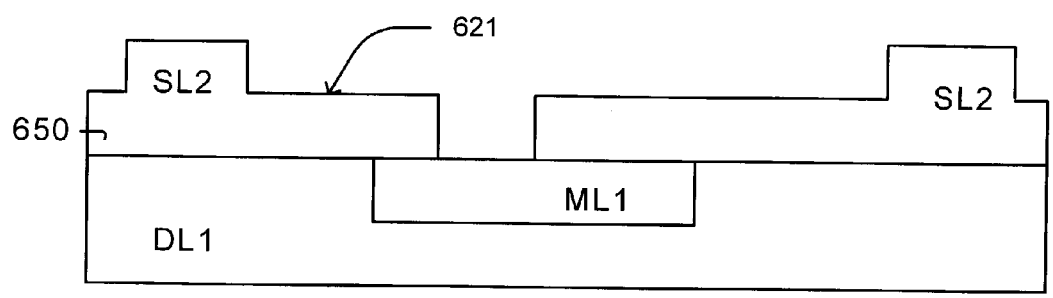

Referring to FIG. 6D, a second dielectric layer (DL2) 650 is formed over the first dielectric layer DL1.

The second dielectric layer (DL2) is patterned to form a second metal area opening 621. Preferably the second metal area opening 621 is formed using a dual damascene photolithography process. Those skilled in art will recognize that there are many possible photo processes to form the opening 620.

Also, the square slots (SL2) 640 642 are defined in the photo process. The square slots are positioned as described above.

Figure 6E:
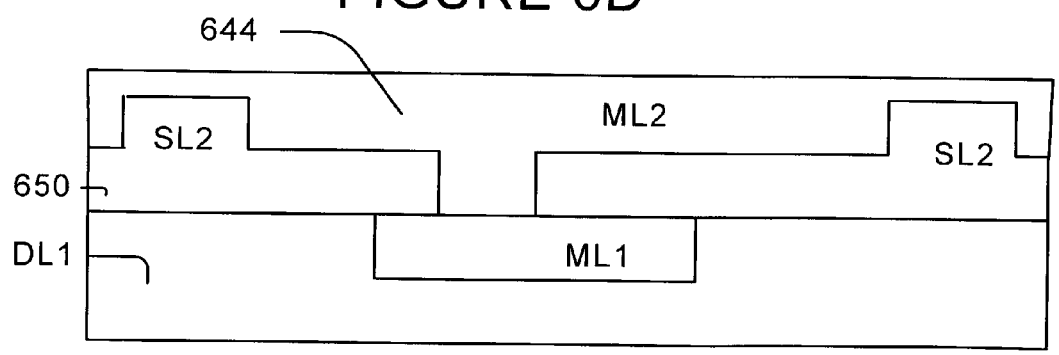

Referring to FIG. 6E, a second metal layer ML2 644 is formed over the surface filling the second metal area opening 620. Preferably the second metal layer ML2 is comprised of a copper alloy.

Next, the second metal layer ML2 644 is polished back to form the structure shown in FIGS. 6A and 6B. The embodiments square slots reduce the dishing problem in the wide metal area because the dielectric slots SL2 polish slower than the metal area ML2.

Figure 9A:
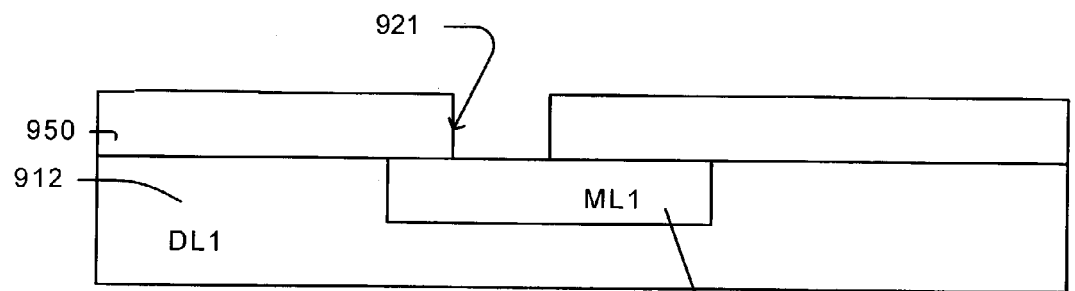
FIGS. 9A, 9B and 9C are cross sectional views of a layout or device having different material filling the slots.
Figure 9B:
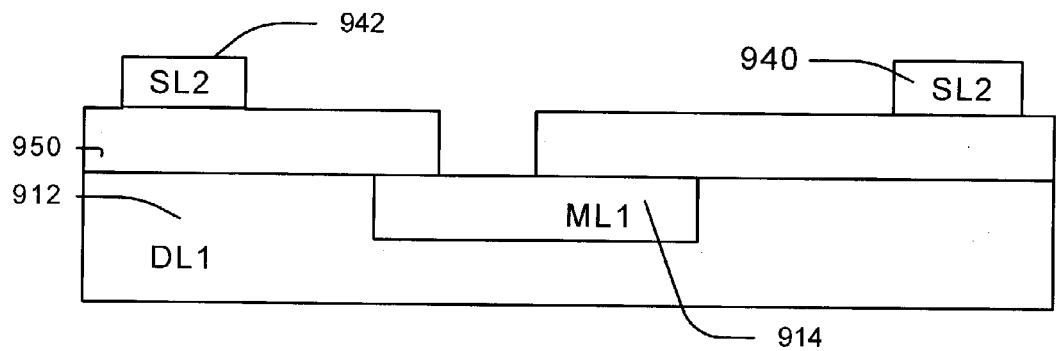
Figure 9C:
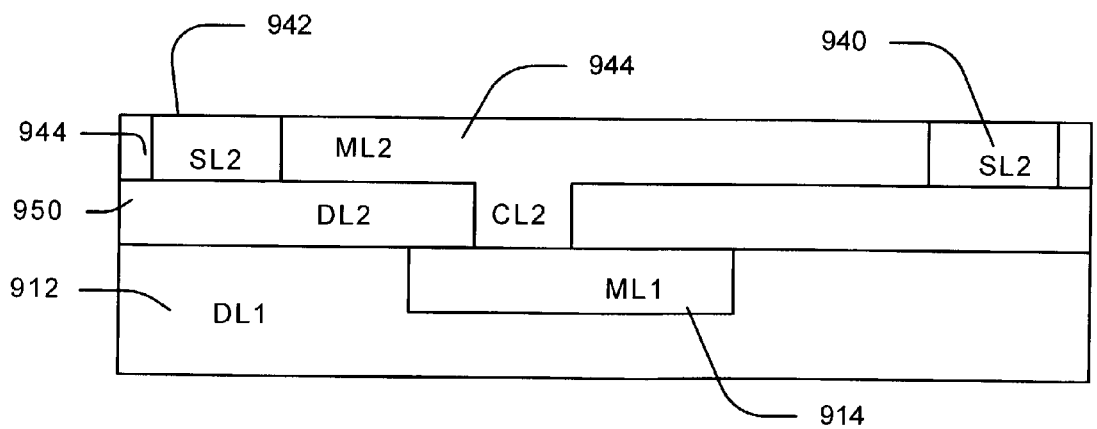

A. FIGS. 9A–9C Process for Forming Slots Regions Comprised of Other Materials.

In an embodiment, the slots are filled with metal or dielectric material. The slots can be filled with material other than the dielectric material of the ILD layer. The slots could be filled with air or a vacuum. A slot regions comprised of metal layer could improve the current capacity of the metal area or metal line.

FIGS. 9A, 9B, and 9C show cross sectional views similar to those in FIGS. 6B to 6E. FIGS. 9A to 9C show a device and process where the slots are filled with a material other than the dielectric layer (e.g., 950-FIG. 9C).

FIG. 9A shows a first dielectric layer 912 with metal area 914. Second dielectric layer 950 is formed over the first dielectric layer 912 and first metal area 914.

An opening 921 (e.g., via opening) is formed in the second dielectric layer 950.

FIG. 9B shows square slot regions 942 and 940 formed over the second dielectric layer 950. A layer can be formed over the second dielectric layer and patterned to form slot regions 940 and 942.

Symmetrical or Square slot regions 942 and 940 can be comprised of conductive or dielectric materials. For example, square slot regions 942 940 could be formed a metal with a different composition that the subsequently formed second metal area 944. For example, the metal area 944 could be comprised of copper and the slot regions 942 940 could be comprised of Al or W. The square slot regions could be comprised of a metal material that has a low CMP rate than the material of the subsequently formed second area 944 (see FIG. 9c). Also, the slot regions 942 940 could be comprised of a dielectric such as an oxide, FTEOS or low-k material (K<3.9).

FIG. 9C shows a second metal area 944 formed with square slots and square slot regions 940 942. A via contact CL2 contacts the first metal layer 914. The second metal area 944 could be formed using a damascene process where the slot regions 940 942 reduce dishing of the metal 944.

Additional metal layers with square slots can be formed over the structure shown in FIG. 9C.

B. Computer System

Figure 10:
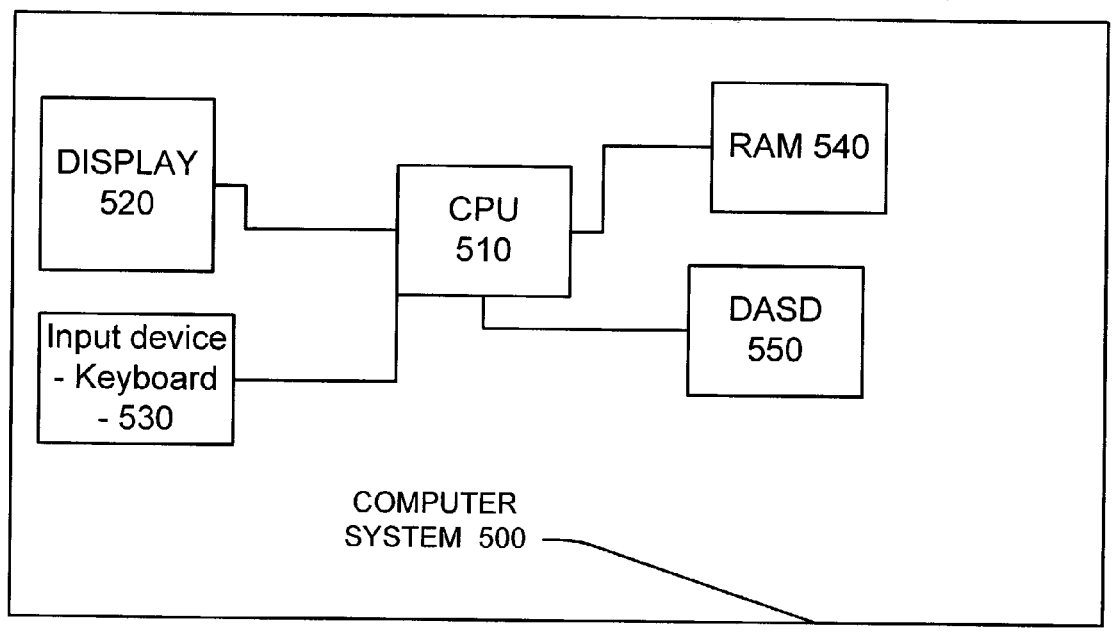
FIG. 10 is a diagram of a computer system upon which an embodiment of the invention can be implemented.

FIG. 10 shows a diagram of a non-limiting example embodiment of a computer that can be used in an embodiment of the invention. Referring to FIG. 10, the computer system 500 shown comprises a CPU (Central Processing Unit) 510, a terminal with a monitor 520 connected to the CPU 510 for receiving data from the CPU 510 and a input device (e.g., keyboard) 530 connected to the CPU 510 for sending data respectively to the CPU 510. A RAM (Random Access Memory) 540 and a DASD 550 associated with the CPU are shown connected for bidirectional communication of data to and from CPU. The slot placing application can run on the computer system or more than one computer system possibly connected by a network. This is an example of a system and network the application can be implemented on.

C. Pre-Existing Initial Slot in Layout

The active layers can further include initial slots that can be added by designers. These slots are generated before the square slots of the embodiment are added. The "initial slots" are treated or classified as non-active areas or metal spacing and the method(s) described above or in FIG. 2 are used to place the square slots. This enables designer to add their own slots and still use the program.

D. Disadvantages of Non-Square Rectangular Slots

In damascene interconnect processes and especially in copper dual damascene process, the copper dishing problem is changing the sheet resistance of the metal lines. Due to Chemical Mechanical Polishing (CMP) for copper lines metal line will be thinned down for wide lines. The inventors have found to reduce the dishing effect, slots are required for wide metal lines.

Typically, foundry customers are asked to draw their own rectangular metal slots. However, the orientation of rectangular metal slots needs to follow the current direction. This causes the designers difficult to put in slots in metal lines.

Furthermore, during tapeout, dielectric slots in metal line design rules checks are difficult to implement. It also reduces the cycle time for tapeout. For example, in case of (non-square) rectangular slot, its orientation to direction of current flow is impossible to check. Then, it is hard to differentiate metal slot and metal space, then maximum space can not be checked due to software limitation.

The embodiments of the invention overcome these and other problems.

V. Computer Programs/Methods

Below is an example of a program to generate and place slots according to an embodiment. This program is based on Mentor Graphics Calibre™ HDRC Version v8.8_6.1 Release (or later). Explanatory comments are in italics and set off by "//".

```
// Get the areas where slot MUST NOT be generated.
noslots = (Fusebot OR Fusetop) OR (IND_MK OR MS_EXCL)
// Fusebot, Fusetop, IND_MK and MS_Excl are areas where metal slots are undesirable.
//Create generic array (odd) of 2x2um rectangles spaced 4um away inside of chip's Border
slot_odd = RECTANGLES 2 2 4 4 INSIDE OF LAYER Border
//Shift the generic "odd" rectangles by 3 um in X axis as even rectangles
slot_even = SHIFT slot_odd BY 3 0
// Get contact and via areas to exclude metal slots
k_cont = SIZE Contact BY 0.1      //Size contact up by 0.1
k_Via1 = SIZE Via1 BY 0.1         //Size via1 up by 0.1
k_Via2 = SIZE Via2 BY 0.1         //Size via2 up by 0.1
k_Via3 = SIZE Via3 BY 0.1         //Size via3 up by 0.1
k_Via4 = SIZE Via4 BY 0.1         //Size via4 up by 0.1
k_TVia = SIZE TopVia BY 0.1       //Size Topvia up by 0.1
// Generate odd slots in Metal1(ODD Layer Metal)
widem1a = SIZE Metal1 BY 6.0 UNDEROVER       //Size away metal <=12um
    widem1 = Metal1 AND widem1a              //Get metal >12um
    m1slotarea1 = SIZE widem1 BY -1          //Keep slot 1um away from edge
    m1slotarea2 = m1slotarea1 NOT ( noslots OR ( k_cont OR k_Via1 ) )  //Get final area where slots can be generated.
    m1slot = slot_odd INSIDE m1slotarea2     //Use only odd rectangles inside of m1slotarea2
    Metal1_op = Metal1_opc NOT m1slot        //use m1slot as cookie cutter to cut out slots in Metal1
// Generate odd slots in Metal2(EVEN Layer Metal)
    widem2a = SIZE Metal2 BY 6.0 UNDEROVER   //Size away metal <=12um
```

```
       widem2 = Metal2 AND widem2a              //Get metal >12um
       m2slotarea1 = SIZE widem2 BY -1          //Keep slot 1um away from edge
       m2slotarea2 = m2slotarea1 NOT ( noslots OR ( k_Vial OR k_Via2 ) )  //Get final area
where slots can be generated.
       m2slot = slot_even INSIDE m2slotarea2    //Use only Even rectangles inside of
m2slotarea2
       Metal2_op = Metal2_opc NOT m2slot        //use m2slot as cookie cutter to cut
out slots in Metal2
// Same as metal1, uses ODD rectangles
     widem3a = SIZE Metal3 BY 6.0 UNDEROVER
     widem3 = Metal3 AND widem3a
     m3slotarea1 = SIZE widem3 BY -1
     m3slotarea2 = m3slotarea1 NOT ( noslots OR ( k_Via2 OR k_Via3 ) )
     m3slot = slot_odd INSIDE m3slotarea2
     Metal3_op = Metal3_opc NOT m3slot
// Same as metal2, uses EVEN rectangles
     widem4a = SIZE Metal4 BY 6.0 UNDEROVER
     widem4 = Metal4 AND widem4a
     m4slotarea1 = SIZE widem4 BY -1
     m4slotarea2 = m4slotarea1 NOT ( noslots OR ( k_Via3 OR k_Via4 ) )
     m4slot = slot_even INSIDE m4slotarea2
     Metal4_op = Metal4_opc NOT m4slot
// Same as metal1, uses ODD rectangles
     widem5a = SIZE Metal5 BY 6.0 UNDEROVER
     widem5 = Metal5 AND widem5a
     m5slotarea1 = SIZE widem5 BY -1
     m5slotarea2 = m5slotarea1 NOT ( noslots OR ( k_Via4 OR k_TVia ) )
     m5slot = slot_odd INSIDE m5slotarea2
     Metal5_op = Metal5_opc NOT m5slot
// Same as metal2, uses EVEN rectangles
     widemta = SIZE MT BY 6.0 UNDEROVER    // 6th (TOP) metal
     widemt = MT AND widemta
     mtslotarea1 = SIZE widemt BY -1
     mtslotarea2 = mtslotarea1 NOT ( noslots OR k_TVia )
     mtslot = slot_even INSIDE mtslotarea2
     MT_op = MT NOT mtslot
```

A preferred embodiment of the invention comprises a computer system for determining a determining the placement of substantially square slots representations in a layout; the layout comprised of a plurality of representations of conductive layers; the conductive layer representations comprised of conductive region representations;

at least one the conductive region representations has a via contact representation between adjacent active layers; the system comprising:

a means for determining the placement of square slots representations in the layout by the following:

a means for setting a reference for the placement of the square slot representations with respect to the layout;

a means for setting the minimum dimensions of the conductive region representations in which the square slot representations are inserted in;

a means for setting the dimensions of the square slot representations;

a means for setting the spacing between the square slot representations in the conductive layer representations;

a means for setting the clearance between the square slot representations on adjacent conductive layer representations;

a means for setting the stagger spacing between rows of adjacent square slot representations in the layer representations;

a means for setting the minimum distance from the edge of the square slot representation to the edge of the conductive region representation;

a means for setting the minimum distance between the contact via representation and the square slot representation.

The listing of the program above shows examples of the "means for" described above.

Note that most metal patterns are rectangular shaped because it is easier to design layouts. However, the invention is suitable were metal lines have other shapes.

In addition, in embodiments where square shaped slots are discussed, other shaped slots are feasible and the embodiments are not limited to square slots. For example, slots with symmetric shapes, especially in the direction of current flow are feasible.

In forming a mask using the embodiments of the invention, the active areas and non-active areas are defined by areas of different transmittance. (e.g., opaque or transparent areas, such as positive or negative masks).

In the above description numerous specific details are set forth such as dimensions, in order to provide a more thorough understanding of the present invention. It will be obvious, however, to one skilled in the art that the present invention may be practiced without these details. In other instances, well known process have not been described in detail in order to not unnecessarily obscure the present invention.

Unless explicitly stated otherwise, each numerical value and range should be interpreted as being approximate as if the word "about" or "approximately" preceded the value of the value or range.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. A method for determining the placement of slots representations in a layout;
   said layout comprised of a plurality of conductive layer representations;
   said conductive layer representation comprised of conductive region representations;
   at least one said conductive region representation has a via contact representation between adjacent conductive layer representations;
   the method comprising the steps of:
   setting a reference for a placement of said slot representations with respect to said layout;
   setting the minimum dimensions of said conductive region representations in which said slot representations are placed;
   setting the dimensions of said slot representations;
   setting the spacing between slot representations in conductive layer representations;
   setting the clearance between the slot representations on adjacent conductive layer representations;
   setting a stagger spacing between rows of adjacent slot representations in conductive layer representations;
   setting the minimum distance from the edge of said slot representations to the edge of said conductive region representations;
   setting the minimum distance between said via contact representation and said slot representation.

2. The method of claim 1 wherein said slots have a substantially square shape.

3. The method of claim 1 wherein said slots have a shape selected from the group consisting of: substantially square, substantially circular, substantially hexagon, and substantially octagon.

4. The method of claim 1 wherein said conductive layer representations represent conductive layers in a semiconductor device.

5. The method of claim 1 which further includes:
   said slots have a shape selected from the group consisting of: substantially square, substantially circular, substantially hexagon, and substantially octagon;
   said reference for the placement of said slot representations is a corner of said layout;
   setting the minimum dimensions of said conductive region representations in which said slot representations are inserted in, to a length greater about 12 μm and a width greater than about 12 μm;
   setting the dimensions of said slot representations to about 2 μm by about 2 μm or about 4 square μm;
   setting the spacing between the slot representations on the same conductive layer representation to about 4 μm;
   setting the clearance between the slot representations on adjacent conductive layers representations to about 1 μm;
   setting the stagger spacing between rows of adjacent slot representations in a single conductive region representation to about 0 μm;
   setting the minimum distance from the edge of said slot representation to the edge of said conductive region representation to about 1 μm;
   setting the minimum distance between said via contact representation and said slot representation to about 1 μm.

6. The method of claim 1 which further includes outputting the placement of said slots representations.

7. The semiconductor device formed using the method of claim 1.

8. The mask formed using the method of claim 1.

9. The computer data generated using the method of claim 1.

10. A method for determining the placement of substantially
    square slots features in a layout of an integrated circuit design;
    said layout comprised of a plurality of active layers;
    said active layers comprised of active regions;
    at least one said active regions has a via contact feature between adjacent active layers;
    the method comprising the steps of:
    setting a reference for a placement of said square slots feature with respect to said layout;
    setting the minimum dimensions of said active regions in which said square slots features are placed;
    setting the dimensions of said square slot features;
    setting the spacing between the square slots features on the same active region;
    setting the clearance between the square slots features on adjacent active layers;
    setting a stagger spacing between rows of adjacent square slots features in said active layers;
    setting the minimum distance from the edge of said square slot features to the edge of said active region;
    setting the minimum distance between said via contact feature and said square slot feature.

11. The method of claim 10 wherein said layout comprises initial slots that are
    added before the determining the placement of the square slots;
    the method further comprises: classifying the initial slots as non-active areas.

12. The method of claim 10 wherein said active layers represent conductive layers in a semiconductor device.

13. The method of claim 10 which further includes
    said reference for the placement of said slots is the bottom left corner of said layout;
    setting the minimum dimensions of said active regions in which said square slots features are inserted in to a minimum length of about 12 μm and a minimum width of about 12 μm;
    setting the dimensions of said square slot features to about 2 μm by about 2 μm;
    setting the spacing between the square slots features on the same active region to about 4 μm;
    setting the clearance between the square slots features on adjacent active layers to about 1 μm;
    setting the stagger spacing between rows of adjacent square slots in the same metal area to about 0 μm;
    setting the minimum distance from the edge of said square slot features to the edge of said active region to about 1 μm;
    setting the minimum distance between said via contact feature and said square slot feature to about 1 μm.

14. The method of claim 10 which further includes outputting the placement of said square slots features.

15. The semiconductor device formed using the method of claim 10.

16. The mask formed using the method of claim 10.

17. The computer data generated using the method of claim 10.

18. The computer implemented method performing the method of claim 10.

19. A computer implemented method for determining the placement of substantially square slots features in a layout of an integrated circuit design;
providing a layout comprised of a plurality of active layers;
said active layers comprised of active regions;
at least one said active regions has a via contact feature between adjacent active layers;
the method comprising the steps of:
setting a reference for a placement of said square slot features with respect to said layout;
setting the minimum dimensions of said active regions in which said square slot features are inserted in to a minimum length of about 12 µm and a minimum width of about 12 µm;
setting the dimensions of said square slot features are about 2 µm by about 2 µm;
setting the spacing between the square slot features on a single active region to about 4 µm;
setting the clearance between the square slot features on adjacent active layers to about 1 µm;
setting a stagger spacing between rows of adjacent square slot features in the same active area to about 0 µm;
setting the minimum distance from the edge of said square slot features to the edge of said active region to about 1 µm;
setting the minimum distance between said via contact feature and said square slot feature to about 1 µm.

20. The method of claim 19 said reference fort he placement of said square slot features is a corner of said layout.

21. The method of claim 19 wherein said square slot features are substantially square.

22. The method of claim 19 wherein said square slots features represent square shapes with lengths and widths of between about 0.5 and 4 µm.

23. The method of claim 19 wherein said active areas are defined using 0.13 µm and 0.09 µm ground rules.

24. The method of claim 19 wherein said layout is represented by a GSD format file; said layout is comprised of layers; said layers are comprised of active layers and square slot layers;
said layers are represented by a GDS layer number, said active layers are represented by a GDS layer number and first data type number;
said square slot layers represented by a GDS layer number and second data type number,
the active layers and square slot layers in the same layer have the same GDS layer number but different data types number.

25. The method of claim 19 wherein the placement of the square slots features comprises: generating said square slot representations; and using a logical "NOT" operation to not out slots in said active layer in a data file that is used to fabricate a mask.

26. The method of claim 19 wherein at least one of said active regions has a dual damascene shape.

27. The method of claim 19 wherein said active regions represent metal lines; pads, and via contacts.

28. The semiconductor device formed using the method of claim 19.

29. The mask formed using the method of claim 19.

30. The computer data generated using the method of claim 19.

31. A semiconductor device comprising:
a plurality metal layers over a substrate; said metal layers comprised of metal areas;
via contacts between said metal layers;
square slots in said metal areas;
said square slots are substantially square;
said square slots positioned as follows:
said square slots placed with respect to a reference point;
said square slots positioned only in metal areas with dimensions greater than a minimum metal area dimensions;
a spacing between said square slots on a single metal area;
a stagger spacing between rows of adjacent square slots in the same metal layer,
a clearance between said square slots on adjacent metal layers;
a minimum distance from the edge of said square slots to the edge of said metal areas;
a minimum distance between said via contact and said square slots.

32. The semiconductor device of claim 31 that further comprises:
said reference is a corner of said layout said layout having a rectangular shape;
said minimum metal area dimensions are a minimum length of about 12 µm and a minimum width of about 12 µm;
said square slot dimension is about 2 µm by about 2 µm;
the spacing between said square slots on the same metal layer is about 4 µm;
the clearance between said square slots on adjacent metal layers is about 1 µm;
said square slots having a stagger spacing between rows of adjacent square slots in the same metal layer to about 0 µm;
the minimum distance from the edge of said square slots to the edge of said metal areas is about 1 µm;
the minimum distance between said via contact and said square slots is about 1 µm.

33. The semiconductor device of claim 31 wherein said square slots are comprised of dielectric material or conductive material.

34. The semiconductor device of claim 31 wherein said square slots have a dimension of between about 1.9 and 2.1 µm.

35. The semiconductor device of claim 31 wherein said metal areas are comprised of copper alloy and have a dual damascene shape.

36. One or more processor readable storage devices having processor readable code embodied on said process readable storage devices, said processor readable code for programming one or more processors to perform a method of determining the placement of substantially square slots representations in a layout;
said layout comprised of a plurality of representations of conductive layers;
said conductive layer representations comprised of conductive region representations;
at least one said conductive region representations has a via contact representation between adjacent active layers;
the method comprising the steps of:
setting a reference for a placement of said square slot representations with respect to said layout;
setting the minimum dimensions of said conductive region representations in which said square slot representations are placed;

setting the dimensions of said square slot representations;

setting the spacing between the square slot representations in a single conductive layer representation;

setting the clearance between the square slot representations on adjacent conductive layer representations;

setting a stagger spacing between rows of adjacent square slot representations in a single conductive region representation;

setting the minimum distance from the edge of said square slot representation to the edge of said conductive region representation;

setting the minimum distance between said via contact representation and said square slot representation.

37. The storage device of claim 36 which further includes said reference for the placement of said square slot representations is a corner of said layout;

setting the minimum dimensions of said conductive region representations in which said square slot representations are inserted in to a minimum length of about 12 μm and a minimum width of about 12 μm;

setting the dimensions of said square slot representations to about 2 μm by about 2 μm;

setting the spacing between the square slot representations on the same conductive region representation to about 4 μm;

setting the clearance between the square slot representations on adjacent conductive layers representations to about 1 μm;

setting the stagger spacing between rows of adjacent square slot representations in said conductive layer representations to about 0 μm;

setting the minimum distance from the edge of said square slot representation to the edge of said conductive region representations to about 1 μm;

setting the minimum distance between said via contact representation and said square slot representation to about 1 μm.

38. The storage device of claim 36 which further includes outputting the placement of said square slots representations.

39. A computer system for determining the placement of substantially square slots representations in a layout; said layout comprised of a plurality of representations of conductive layers; said conductive layer representations comprised of conductive region representations; at least one said conductive region representations has a via contact representation between adjacent active layers; the system comprising:

a means for determining a placement of square slots representations in said layout by the following:

a means for setting a reference for the placement of said square slot representations with respect to said layout;

a means for setting the minimum dimensions of said conductive region representations in which said square slot representations are inserted in;

a means for setting the dimensions of said square slot representations;

a means for setting the spacing between the square slot representations in said conductive layer representations;

a means for setting the clearance between the square slot representations on adjacent conductive layer representations;

a means for setting a stagger spacing between rows of adjacent square slot representations in said layer representations;

a means for setting the minimum distance from the edge of said square slot representation to the edge of said conductive region representation;

a means for setting the minimum distance between said via contact representation and said square slot representation.

40. The computer system of claim 39 wherein:

said means for determining the placement of square slots representations in said layout further includes:

said reference for the placement of said square slot representations is a corner of said layout;

said means for setting the minimum dimensions of said conductive region representations in which said square slot representations are inserted in to a length greater than about 12 μm and a width greater than about 12 μm;

said means for setting the dimensions of said square slot representations to about 2 μm by about 2 μm;

said means for setting the spacing between the square slot representations on the conductive layer representations to about 4 μm;

said means for setting the clearance between the square slot representations on adjacent conductive layers representations to about 1 μm;

said means for setting the stagger spacing between rows of adjacent square slot representations in a single conductive region representation to about 0 μm;

said means for setting the minimum distance from the edge of said square slot representation to the edge of said conductive region representation to about 1 μm;

said means for setting the minimum distance between said via contact representation and said square slot representation to about 1 μm.

41. The system of claim 39 which further includes a means for outputting the placement of said square slots representations.

* * * * *

UNITED STATES PATENT AND TRADEMARK OFFICE
CERTIFICATE OF CORRECTION

| | |
|---|---|
| PATENT NO. | : 7,089,522 B2 |
| APPLICATION NO. | : 10/458992 |
| DATED | : August 8, 2006 |
| INVENTOR(S) | : Tan Patrick et al. |

Page 1 of 1

It is certified that error appears in the above-identified patent and that said Letters Patent is hereby corrected as shown below:

In issued Claim 4, col. 15, line 39, please add the phrase -- used in connecting circuit elements -- before "in a semiconductor device.".

Signed and Sealed this

Thirteenth Day of March, 2007

JON W. DUDAS
*Director of the United States Patent and Trademark Office*